(12) United States Patent
Oda

(10) Patent No.: US 11,431,360 B2
(45) Date of Patent: Aug. 30, 2022

(54) RADIO-FREQUENCY MODULE AND COMMUNICATION DEVICE

(71) Applicant: Murata Manufacturing Co., Ltd., Nagaokakyo (JP)

(72) Inventor: Tomoya Oda, Nagaokakyo (JP)

(73) Assignee: MURATA MANUFACTURING CO., LTD, Nagaokakyo (JP)

( * ) Notice: Subject to any disclaimer, the term of this patent is extended or adjusted under 35 U.S.C. 154(b) by 0 days.

(21) Appl. No.: 17/322,909

(22) Filed: May 18, 2021

(65) Prior Publication Data

US 2021/0391878 A1 Dec. 16, 2021

(30) Foreign Application Priority Data

Jun. 12, 2020 (JP) .............................. JP2020-102273

(51) Int. Cl.
| | | |
|---|---|---|
| *H04B 1/04* | (2006.01) | |
| *H03F 3/24* | (2006.01) | |
| *H01Q 1/22* | (2006.01) | |
| *H05K 1/02* | (2006.01) | |
| *H05K 1/11* | (2006.01) | |

(52) U.S. Cl.
CPC .............. *H04B 1/04* (2013.01); *H03F 3/245* (2013.01); *H05K 1/11* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 2006/0276157 A1* | 12/2006 | Chen | ................... | H01Q 1/2283 |
| | | | | 455/333 |
| 2015/0119102 A1* | 4/2015 | Saji | ..................... | H01L 23/5384 |
| | | | | 455/550.1 |
| 2020/0251459 A1* | 8/2020 | Tsuda | ..................... | H01L 23/552 |
| 2021/0335734 A1* | 10/2021 | You | ...................... | H01Q 1/2283 |
| 2021/0384927 A1* | 12/2021 | Hayakawa | ........... | H05K 1/0243 |

FOREIGN PATENT DOCUMENTS

| | | | | | |
|---|---|---|---|---|---|
| CN | 102651393 | A | * | 8/2012 | ......... H01L 29/0619 |
| CN | 111279469 | A | * | 6/2020 | ........... H01L 23/053 |
| JP | 2018-137522 | A | | 8/2018 | |
| KR | 20220010016 | A | * | 1/2022 | ............... H04B 1/50 |
| WO | WO-2015029680 | A1 | * | 3/2015 | ................ H01P 1/36 |

* cited by examiner

*Primary Examiner* — Pablo N Tran
(74) *Attorney, Agent, or Firm* — Xsensus LLP

(57) ABSTRACT

A module substrate has first and second main surfaces that on opposite sides of the module substrate, a resin member that covers the second main surface, and a plurality of post electrodes that are spaced apart from each other on the second main surface and penetrate through the resin member from the second main surface. The plurality of post electrodes includes a first post electrode and a first recess recessed toward the second main surface and formed in at least part of a region of the surface of the resin member that surrounds a leading end part of the first post electrode.

20 Claims, 5 Drawing Sheets

RADIO-FREQUENCY MODULE AND COMMUNICATION DEVICE

CROSS-REFERENCE TO RELATED APPLICATION

The present application claims priority to Japanese patent application JP2020-102273, filed Jun. 12, 2020, the entire contents of which being incorporated herein by reference.

BACKGROUND

1. Field

The present disclosure relates to a radio-frequency (RF) module and a communication device.

2. Description of the Related Art

In mobile communication devices such as mobile phones, the arrangement configurations of circuit components forming radio-frequency front end modules have been becoming increasingly complex, particularly with the development of multiband technologies.

Japanese Unexamined Patent Application Publication No. 2018-137522 discloses a radio-frequency module in which power amplifiers, low-noise amplifiers, switches, filters, and so on are integrated into a package.

The distances between a plurality of external connection terminals for connection to a mother board may become shorter and the isolation characteristics of the plurality of the external connection terminals may deteriorate as such a radio-frequency module is reduced in size.

SUMMARY

Accordingly, the present disclosure provides a radio-frequency module and a communication device that can improve the isolation characteristics of external connection terminals.

A radio-frequency module according to an aspect of the present disclosure includes: a module substrate has first and second main surfaces that on opposite sides of the module substrate, a resin member that covers the second main surface, and a plurality of post electrodes that are spaced apart from each other on the second main surface and penetrate through the resin member from the second main surface. The plurality of post electrodes includes a first post electrode and a first recess recessed toward the second main surface and formed in at least part of a region of the surface of the resin member that surrounds a leading end part of the first post electrode.

The radio-frequency module of the aspect of the present disclosure is able to improve the isolation characteristics of external connection terminals.

Other features, elements, characteristics, and advantages of the present disclosure will become more apparent from the following detailed description of preferred embodiments of the present disclosure with reference to the attached drawings.

DESCRIPTION OF THE PREFERRED EMBODIMENTS

Figure 1:
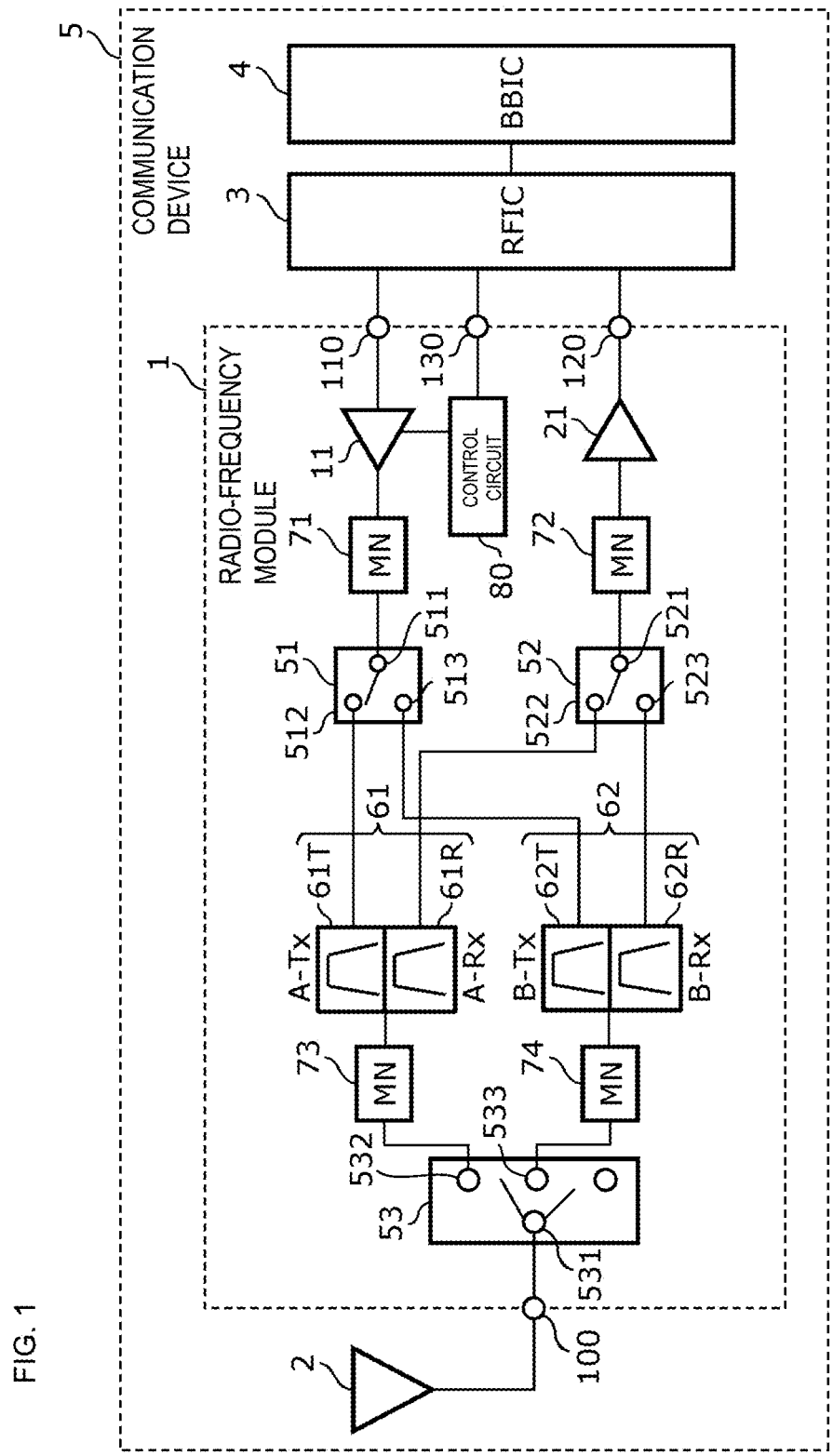
FIG. 1 is a circuit configuration diagram of a radio-frequency module and a communication device according to an embodiment.

Hereafter, embodiments of the present disclosure will be described in detail using the drawings. The embodiments described hereafter each illustrate a comprehensive or specific example of the present disclosure. The numerical values, shapes, materials, constituent elements, arrangements of the constituent elements, the ways in which the constituent elements are connected, and so forth described in the following embodiments are merely examples and are not intended to limit the present disclosure.

The drawings are schematic diagrams in which certain elements are emphasized or omitted or their proportions are adjusted as appropriate in order to illustrate the present disclosure, the drawings are not necessarily illustrated in a strictly accurate manner, and the actual shapes, positional relationships, and proportions may be different. In the drawings, configurations that are substantially the same as each other may be denoted by the same symbols and repeated description thereof may be omitted or simplified.

In the drawings referred to below, an x axis and a y axis are axes that are perpendicular to each other on a plane that is parallel to main surfaces of a module substrate. In addition, a z axis is an axis that is perpendicular to the main surfaces of the module substrate, and a positive z axis direction indicates an upward direction and a negative z axis direction indicates a downward direction.

In addition, in the circuit configurations of the present disclosure, the meaning of "connected" includes not only direct connections with connection terminals and/or wiring conductors, but also electrical connections realized via other circuit elements. Furthermore, "connected between A and B" means connected to both A and B between A and B.

In addition, with respect to arrangement of components in the present disclosure, "a plan view of the module substrate" refers to objects being viewed from the positive z-axis side as orthographic projections onto the xy-plane. In addition, terms that indicate relationships between elements, such as "parallel" and "perpendicular," are not intended to express only a strict meaning, but are also intended to include substantially equivalent ranges that include, for example, differences on the order of a few percent.

Embodiment

1.1 Circuit Configurations of Radio-Frequency Module and Communication Device First, the circuit configurations of a radio-frequency module 1 and a communication device 5 according to this embodiment will be described while referring to FIG. 1. FIG. 1 is a circuit configuration diagram of the radio-frequency module 1 and the communication device 5 according to the embodiment.

1.1.1 Circuit Configuration of Communication Device

First, the circuit configuration of the communication device 5 will be described. As illustrated in FIG. 1, the communication device 5 according to this embodiment includes a radio-frequency module 1, an antenna 2, an RFIC 3, and a BBIC 4. In this exemplary configuration the communication device 5 is a multi-band transceiver. As used in this specification the term "module", as used with "radio frequency module", or "RF front-end module" should be construed as circuitry (programmable, as well as discrete) and associated circuit components, such as circuit boards, RF shielding, etc.

The radio-frequency module 1 transmits radio-frequency signals between the antenna 2 and the RFIC 3. The detailed circuit configuration of the radio-frequency module 1 will be described later.

The antenna element 2 is connected to an antenna connection terminal 100 of the radio-frequency module 1 and transmits a radio-frequency signal output from the radio-frequency module 1 and receives a radio-frequency signal from the outside and outputs the received radio-frequency signal to the radio-frequency module 1.

The RFIC 3 is an example of a signal processing circuit that processes radio-frequency signals. Specifically, the RFIC 3 subjects a radio-frequency reception signal input thereto via a reception path of the radio-frequency module 1 to signal processing using down conversion and so forth and outputs a reception signal generated through this signal processing to the BBIC 4. In addition, the RFIC 3 subjects a transmission signal input thereto from the BBIC 4 to signal processing using up conversion and so forth and outputs a radio-frequency transmission signal generated through this signal processing to a transmission path of the radio-frequency module 1. In addition, the RFIC 3 includes a control unit (or controller, or control circuitry) that controls switches, amplifiers, and so forth of the radio-frequency module 1. Some or all of the functions of the control unit of the RFIC 3 may be implemented outside the RFIC 3, for example, in the BBIC 4 or the radio-frequency module 1.

The BBIC 4 is a base band signal processing circuit that performs signal processing using an intermediate frequency band located at a lower frequency than radio-frequency signals that are transmitted by the radio-frequency module 1. A signal processed by the BBIC 4 is used as an image signal for image display and/or as an audio signal for a telephone call via a speaker, for example.

The antenna element 2 and the BBIC 4 are not essential constituent elements of the communication device 5 according to this embodiment.

1.1.2 Circuit Configuration of Radio-Frequency Module

Next, the circuit configuration of the radio-frequency module 1 will be described. As illustrated in FIG. 1, the radio-frequency module 1 includes a power amplifier 11, a low-noise amplifier 21, switches 51 to 53, duplexers 61 and 62, matching networks (MN) 71 to 74, a control circuit 80, the antenna connection terminal 100, a radio-frequency input terminal 110, a radio-frequency output terminal 120, and a control terminal 130.

The antenna connection terminal 100 is an example of an external connection terminal and is connected to the antenna 2.

The radio-frequency input terminal 110 is an example of an external connection terminal and is a terminal for receiving a radio-frequency transmission signal from outside the radio-frequency module 1. In this embodiment, the radio-frequency input terminal 110 transmits transmission signals of communication bands A and B to the radio-frequency module 1 from the RFIC 3.

"Communication bands" refer to frequency bands pre-defined by a standardization organization (e.g., third Generation Partnership Project (3GPP), Institute of Electrical and Electronics Engineers (IEEE), and so on) for communication systems. "Communication system" refers to a communication system constructed using radio access technology (RAT). In this embodiment, for example, the 5th generation new radio (5GNR) system, the long term evolution (LTE) system, and the wireless local area network (WLAN) system can be used as a communication system, but the communication system is not limited to these examples.

The radio-frequency output terminal 120 is an example of an external connection terminal and is a terminal for supplying a radio-frequency reception signal to outside the radio-frequency module 1. In this embodiment, the radio-frequency output terminal 120 transmits reception signals of communication band A and communication band B to the RFIC 3 from the radio-frequency module 1.

The control terminal 130 is an example of an external connection terminal and is a terminal for transmitting a control signal. In other words, the control terminal 130 is a terminal for receiving a control signal from outside the radio-frequency module 1 and/or for supplying a control signal to outside the radio-frequency module 1. A "control signal" is a signal related to control of electronic components included in the radio-frequency module 1. Specifically, a control signal is, for example, a digital signal for controlling the power amplifier 11.

The power amplifier 11 amplifies a radio-frequency signal received by the radio-frequency input terminal 110. In this case, the power amplifier 11 amplifies radio-frequency signals of the communication bands A and B input from the radio-frequency input terminal 110. The power amplifier 11 may, for example, be a multistage amplifier and/or an amplifier that converts signals into a differential signal and amplifies the differential signal, but is not limited to these types of amplifiers.

The low-noise amplifier 21 amplifies a radio-frequency signal received by the antenna connection terminal 100. In this case, the low-noise amplifier 21 amplifies reception signals of communication bands A and B input from the antenna connection terminal 100 via the switch 53, the duplexers 61 and 62, and the switch 52. A radio-frequency signal amplified by the low-noise amplifier 21 is output to the radio-frequency output terminal 120. The low-noise amplifier 21 may, for example, be a multistage amplifier and/or an amplifier that converts signals into a differential signal and amplifies the differential signal, but is not limited to these types of amplifiers.

The duplexer 61 allows radio-frequency signals of communication band A to pass therethrough. The duplexer 61 transmits a transmission signal and a reception signal of communication band A using a frequency division duplex (FDD) method. The duplexer 61 includes a transmission filter 61T (A-Tx) and a reception filter 61R (A-Rx).

The transmission filter 61T is connected between the power amplifier 11 and the antenna connection terminal 100. The transmission filter 61T allows a signal of a transmission band of communication band A, out of a radio-frequency transmission signal amplified by the power amplifier 11, to pass therethrough. In other words, the transmission filter 61T has a pass band that includes the transmission band of communication band A.

The reception filter 61R is connected between the low-noise amplifier 21 and the antenna connection terminal 100. The reception filter 61R allows a signal of the reception band of communication band A, out of a radio-frequency reception signal input from the antenna connection terminal 100, to pass therethrough. In other words, the reception filter 61R has a pass band that includes the reception band of communication band A.

The duplexer 62 allows radio-frequency signals of communication band B to pass therethrough. The duplexer 62 transmits a transmission signal and a reception signal of communication band B using the FDD method. The duplexer 62 includes a transmission filter 62T (B-Tx) and a reception filter 62R (B-Rx).

The transmission filter 62T is connected between the power amplifier 11 and the antenna connection terminal 100. The transmission filter 62T allows a signal of a transmission band of communication band B, out of a radio-frequency transmission signal amplified by the power amplifier 11, to pass therethrough. In other words, the transmission filter 62T has a pass band that includes the transmission band of communication band B.

The reception filter 62R is connected between the low-noise amplifier 21 and the antenna connection terminal 100. The reception filter 62R allows a signal of the reception band of communication band B, out of a radio-frequency reception signal input from the antenna connection terminal 100, to pass therethrough. In other words, the reception filter 62R has a pass band that includes the reception band of communication band B.

The switch 51 is connected between the transmission filters 61T and 62T and the power amplifier 11. Specifically, the switch 51 has a terminal 511, a terminal 512, and a terminal 513. The terminal 511 is connected to the power amplifier 11 via the matching network 71. The terminal 512 and the terminal 513 are respectively connected to the transmission filters 61T and 62T. In this connection configuration, the switch 51 can connect either the terminal 512 or the terminal 513 to the terminal 511 on the basis of a control signal from the RFIC 3, for example. In other words, the switch 51 can switch between connecting the power amplifier 11 and the transmission filter 61T to each other and connecting the power amplifier 11 and the transmission filter 62T to each other. The switch 51 is, for example, formed of single pole double throw switch circuit and is called a "band select switch".

The switch 52 is connected between the reception filters 61R and 62R and the low-noise amplifier 21. Specifically, the switch 52 has a terminal 521, a terminal 522, and a terminal 523. The terminal 521 is connected to the low-noise amplifier 21 via the matching network 72. The terminal 522 and the terminal 523 are respectively connected to the reception filters 61R and 62R. In this connection configuration, the switch 52 can connect either the terminal 522 or the terminal 523 to the terminal 521 on the basis of a control signal from the RFIC 3, for example. In other words, the switch 52 can switch between connecting the low-noise amplifier 21 and the reception filter 61R to each other and connecting the low-noise amplifier 21 and the reception filter 62R to each other. The switch 52 is, for example, formed of an SPDT switch circuit.

The switch 53 is connected between the antenna connection terminal 100 and the duplexers 61 and 62. Specifically, the switch 53 has a terminal 531, a terminal 532, and a terminal 533. The terminal 531 is connected to the antenna connection terminal 100. The terminal 532 is connected to the duplexer 61 via the matching network 73. The terminal 533 is connected to the duplexer 62 via the matching network 74. In this connection configuration, the switch 53 can connect either or both of the terminal 532 and the terminal 533 to the terminal 531 on the basis of a control signal from the RFIC 3, for example. In other words, the switch 53 can switch between connecting and disconnecting the antenna 2 and the duplexer 61 and can switch between connecting and disconnecting the antenna 2 and the duplexer 62. The switch 53 is, for example, formed of a multiple-connection switch circuit and is called an antenna switch.

The matching network 71 is, for example, formed of an inductor and/or a capacitor and matches the impedance between the power amplifier 11 and the transmission filters 61T and 62T. The matching network 71 is connected between the power amplifier 11 and the transmission filters 61T and 62T. Specifically, the matching network 71 is connected to an output of the power amplifier 11 and is connected to the transmission filters 61T and 62T via the switch 51.

The matching network 72 is, for example, formed of an inductor and/or a capacitor and matches the impedance between the low-noise amplifier 21 and the reception filters 61R and 62R. The matching network 72 is connected between the low-noise amplifier 21 and the reception filters 61R and 62R. Specifically, the matching network 72 is connected to an input of the low-noise amplifier 21 and is connected to the reception filters 61R and 62R via the switch 52.

The matching network 73 is, for example, formed of an inductor and/or a capacitor and matches the impedance between the antenna 2 and the duplexer 61. The matching network 73 is connected between the antenna connection terminal 100 and the duplexer 61. Specifically, the matching network 73 is connected to the duplexer 61 and is connected to the antenna connection terminal 100 via the switch 53.

The matching network 74 is, for example, formed of an inductor and/or a capacitor and matches the impedance between the antenna 2 and the duplexer 62. The matching network 74 is connected between the antenna connection terminal 100 and the duplexer 62. Specifically, the matching network 74 is connected to the duplexer 62 and is connected to the antenna connection terminal 100 via the switch 53.

The control circuit 80 is connected to the control terminal 130. The control circuit 80 receives a control signal from the RFIC 3 via the control terminal 130 and outputs the control signal to at least one out of the switches 51 to 53, the power amplifier 11, and the low-noise amplifier 21. The control circuit 80 may output a control signal to other electronic components.

Some of the circuit elements illustrated in FIG. 1 do not have to be included in the radio-frequency module 1. For example, the radio-frequency module 1 may include the power amplifier 11 and the low-noise amplifier 21 and does not have to include the other circuit elements.

Furthermore, in the circuit configuration of the radio-frequency module 1, transmission signals and reception signals can be communicated using an FDD method, but the circuit configuration of the radio-frequency module 1 according to this embodiment of the present disclosure is not limited to this example. For example, the radio-frequency module 1 according to the embodiment of the present disclosure may have a circuit configuration in which transmission signals and reception signals can be communicated using a time division duplex (TDD) method or may have a circuit configuration in which transmission signals and reception signals can be communicated using both an FDD method and a TDD method. In addition, the radio-frequency module according to the embodiment of the present disclosure may have a circuit configuration in which only a transmission signal or a reception signal can be transmitted.

1.2 Arrangement of Components of Radio-Frequency Module

Next, the arrangement of components of the thus-configured radio-frequency module 1 will be specifically described while referring to FIGS. 2A to 4.

Figure 2A:
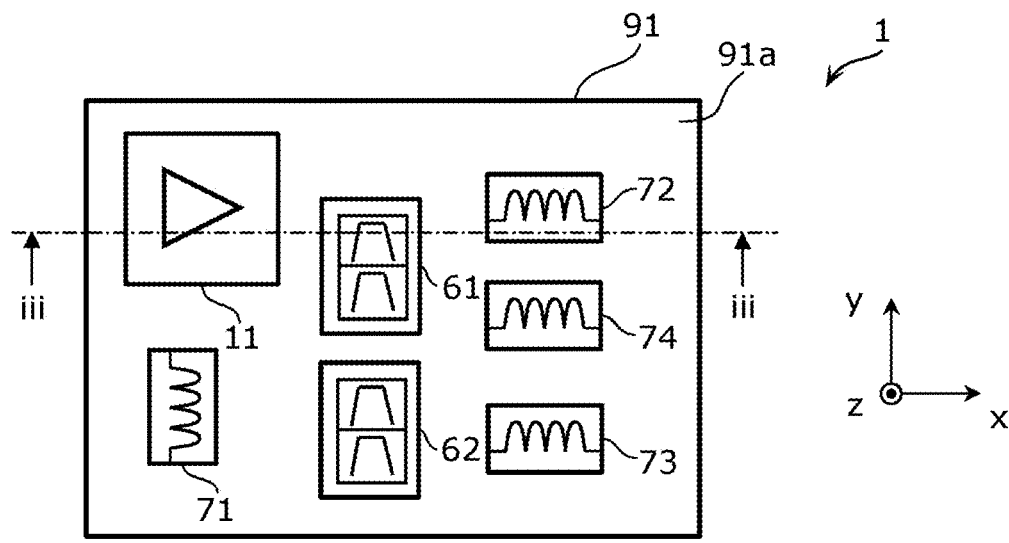
FIG. 2A is a plan view of the radio-frequency module according to the embodiment.
Figure 2B:
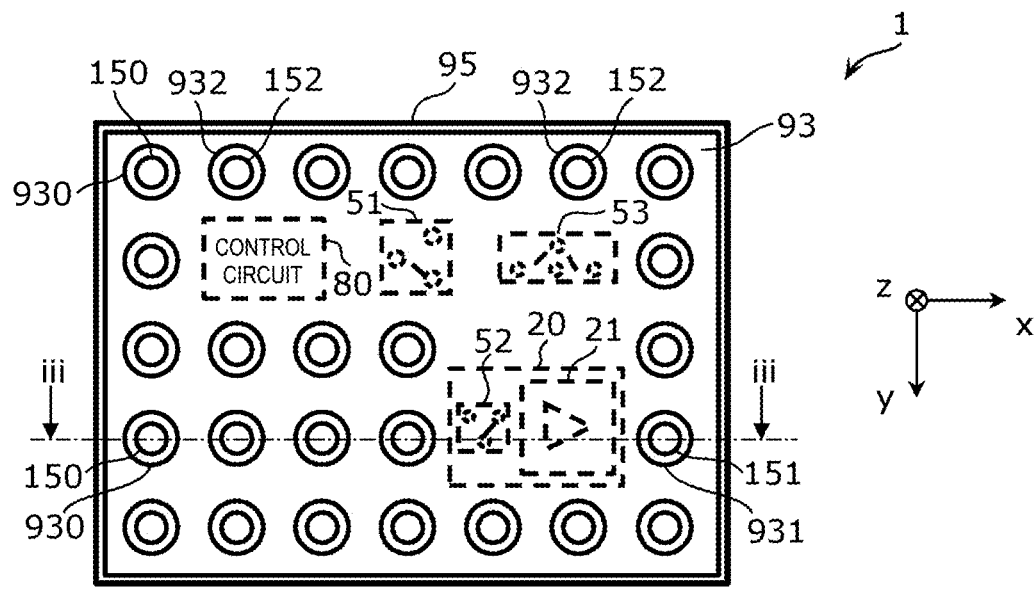
FIG. 2B is a plan view of the radio-frequency module according to the embodiment.
Figure 3:
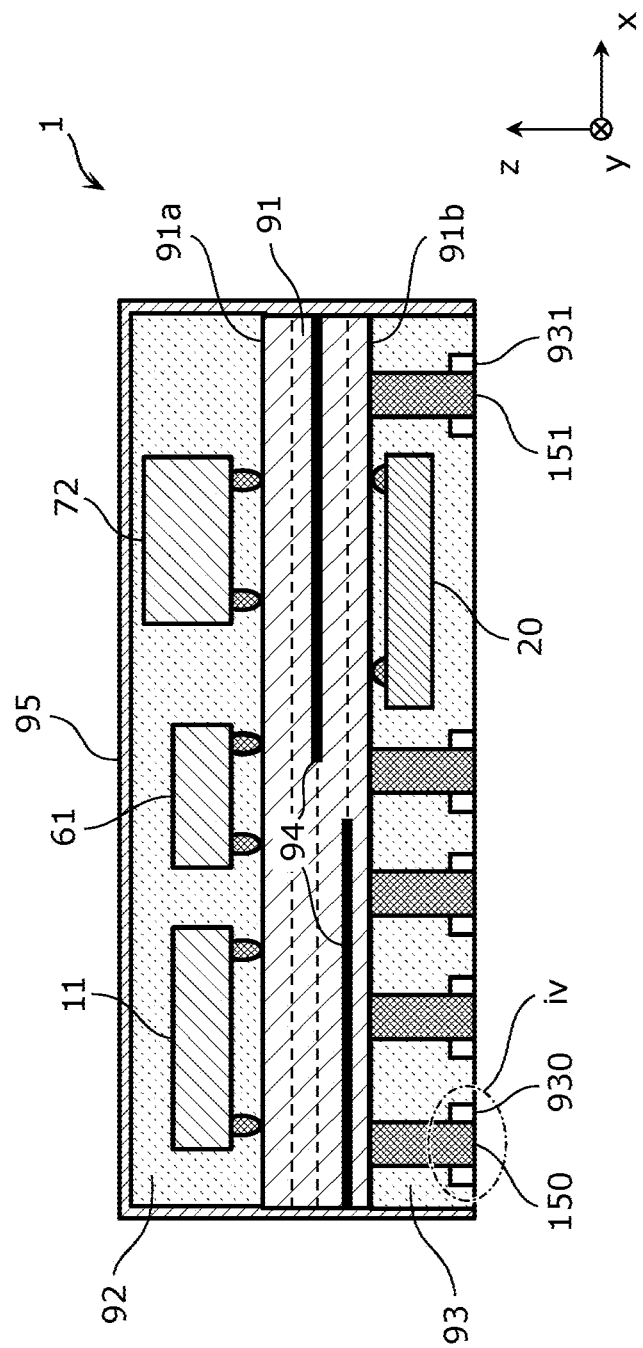
FIG. 3 is a sectional view of the radio-frequency module according to the embodiment.

FIGS. 2A and 2B are plan views of the radio-frequency module 1 according to the embodiment. Specifically, FIG. 2A is a plan view of the radio-frequency module 1 viewed from above and FIG. 2B is a plan view (bottom view) of the radio-frequency module 1 viewed from below. FIG. 3 is a sectional view of the radio-frequency module 1 according to the embodiment. The cross section of the radio-frequency module 1 in FIG. 3 is a cross section taken along line iii-iii in FIGS. 2A and 2B.

As illustrated in FIGS. 2A to 3, in addition to the circuit components constituted by the circuit elements illustrated in FIG. 1, the radio-frequency module 1 further includes a module substrate 91, resin members 92 and 93, ground electrode patterns 94, and a shield electrode layer 95. In addition, the radio-frequency module 1 includes a plurality of post electrodes 150 as a plurality of external connection terminals. In FIG. 2A, illustration of the resin member 92 and the shield electrode layer 95 is omitted and components inside the resin member 93 are indicated by broken lines in FIG. 2B.

The module substrate 91 has main surfaces 91a and 91b, which are on opposite sides of the module substrate. In this embodiment, the module substrate 91 is a multilayer substrate and wiring patterns including the ground electrode patterns 94 are formed thereinside. For example, a low-temperature co-fired ceramic (LTCC) substrate or a high-temperature co-fired ceramic (HTCC) substrate having a multilayer structure consisting of a plurality of dielectric layers, a built-in-component substrate, a substrate having a redistribution layer (RDL), or a printed substrate can be used as the module substrate 91, but the module substrate 91 is not limited to these examples.

The main surface 91a is an example of a first main surface and may also be referred to as an upper surface or a front surface. As illustrated in FIGS. 2A and 3, the power amplifier 11, the duplexers 61 and 62, the matching networks 71 to 74, and the resin member 92 are arranged on the main surface 91a.

The duplexers 61 and 62 may be, for example, surface acoustic wave filters, acoustic wave filters using bulk acoustic waves (BAWs), LC resonance filters, or dielectric filters, but are not restricted to these kinds of filters.

The resin member 92 is arranged on the main surface 91a of the module substrate 91 and covers the circuit components on the main surface 91a. The resin member 92 has a function of ensuring the reliability, in terms of mechanical strength, moisture resistance and so on, of the main surface 91a and the circuit components on the main surface 91a.

The main surface 91b is an example of a second main surface and may also be referred to as a lower surface or a rear surface. As illustrated in FIGS. 2B and 3, the low-noise amplifier 21, the switches 51 to 53, the control circuit 80, the resin member 93, and the plurality of post electrodes 150 are arranged on the main surface 91b.

The low-noise amplifier 21 and the switch 52 are built into a single semiconductor component 20. The semiconductor component 20 is also referred to as a semiconductor integrated circuit and is an electronic component in which electronic circuits are formed on the surface of and inside a semiconductor chip (also called a die).

The semiconductor component 20 may be, for example, formed using a complementary metal oxide semiconductor (CMOS) process, and specifically may be formed using a silicon on insulator (SOI) process. This enables the semiconductor component 20 to be cheaply manufactured. The semiconductor component 20 may be formed using at least one out of GaAs, SiGe, and GaN. This enables a high-quality semiconductor component 20 to be realized.

The plurality of post electrodes 150 function as a plurality of external connection terminals including the antenna connection terminal 100, the radio-frequency input terminal 110, the radio-frequency output terminal 120, and the control terminal 130. The plurality of post electrodes 150 are arranged so as to be spaced away from each other on the main surface 91b of the module substrate 91 and extend vertically from the main surface 91b. Here, the plurality of post electrodes 150 each have a substantially cylindrical shape. In addition, the plurality of post electrodes 150 penetrate through the resin member 93 and leading end parts thereof are exposed from the resin member 93. The leading end parts of the plurality of post electrodes 150 exposed from the resin member 93 are connected to input/output terminals and/or ground electrodes and so forth on a mother board arranged in the negative z-axis direction from the radio-frequency module 1.

The plurality of post electrodes 150 includes a first post electrode 151 and two second post electrodes 152. In this embodiment, the first post electrode 151 functions as the radio-frequency output terminal 120. In addition, the two second post electrodes 152 respectively function as the antenna connection terminal 100 and the control terminal 130.

The resin member 93 is arranged on the main surface 91b of the module substrate 91 and covers the main surface 91b. The resin member 93 has a function of ensuring the reliability, in terms of mechanical strength, moisture resistance and so on, of the main surface 91b and the circuit components on the main surface 91b.

Furthermore, a plurality of recesses 930, which are recessed toward the main surface 91b, are formed in regions of the surface of the resin member 93 that surround the leading end parts of the plurality of post electrodes 150. Therefore, the plurality of recesses 930 are interposed between adjacent post electrodes 150 in a plan view of the module substrate 91.

The plurality of recesses 930 are separated from each other and are not connected to each other. In other words, the plurality of recesses 930 are separated from each other by the resin member 93 in a plan view of the module substrate 91. In other words, the resin member 93 is interposed between adjacent recesses 930 in a plan view of the module substrate 91.

A first recess 931 is one recess among the plurality of recesses 930 and is formed in a region that surrounds the leading end part of the first post electrode 151. In addition, two second recesses 932 are two recesses among the plurality of recesses 930 and are formed in regions that surround the leading end parts of the two second post electrodes 152.

As illustrated in FIG. 2B, the plurality of recesses 930 have substantially annular shapes and surround the entire peripheries of the leading end parts of the corresponding post electrodes 150 in a plan view of the module substrate 91. In addition, as illustrated in FIG. 3, the depths (length along z axis) of the plurality of recesses 930 are smaller than the thickness (length along z axis) of the resin member 93. Therefore, the bottoms of the plurality of recesses 930 do not reach the main surface 91b of the module substrate 91.

Figure 4:
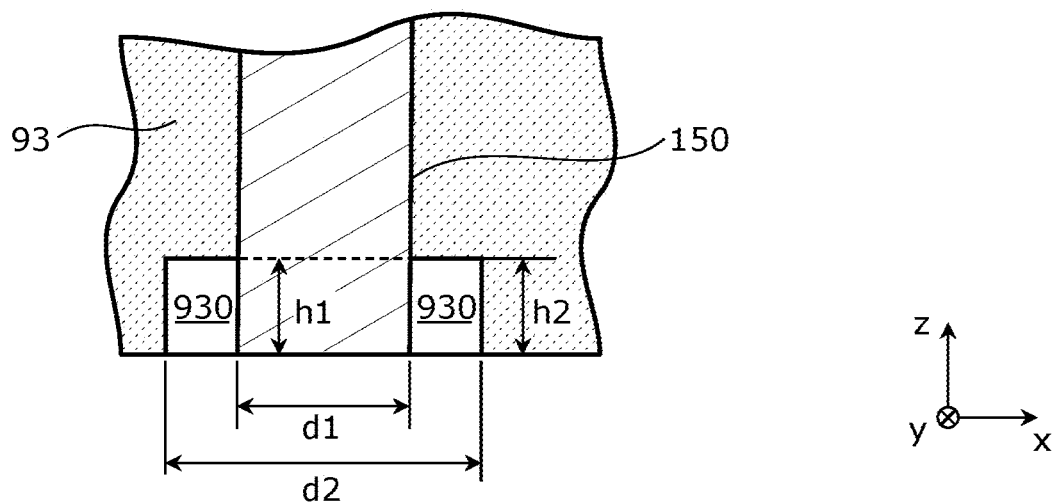
FIG. 4 is an enlarged sectional view of a post electrode and a resin member of the radio-frequency module of the embodiment.

Here, the size of the recesses 930 will be described in more detail while referring to FIG. 4. FIG. 4 is an enlarged sectional view of one of the post electrodes 150 and the resin member 93 of the radio-frequency module 1 of the embodiment.

As illustrated in FIG. 4, a diameter d1 of each post electrode 150 is smaller than a diameter d2 of each recess 930. In addition, a depth h2 of the recesses 930 is greater than or equal to a height h1 of the parts of the post electrodes 150 that are exposed from the resin member 93. In FIG. 4, the depth h2 is equal to the height h1. The depth h2 is the length of the recesses 930 along the z axis and the height h1 is the length of the exposed parts of the post electrodes 150 along the z axis. Thus, the leading end parts of the post electrodes 150 do not protrude beyond the recesses 930 and are accommodated inside the recesses 930.

Note that the recesses 930 do not have to be formed for all of the plurality of post electrodes 150. In other words, all of the plurality of recesses 930 illustrated in FIG. 2B do not have to be formed in the resin member 93. For example, only the first recess 931 for the first post electrode 151 may be formed in the resin member 93. In addition, for example, only the first recess 931 or only the two second recesses 932 for the two second post electrodes 152 may be formed in the resin member 93.

The shield electrode layer 95 maybe me a multi-sided layer and is, for example, a thin metal film formed using a sputtering method and is formed so as to cover the upper surface and side surfaces of the resin member 92 and the side surfaces of the module substrate 91 and the resin member 93. The shield electrode layer 95 is set to the ground potential and suppresses entry of external noise into the circuit components making up the radio-frequency module 1. The radio-frequency module 1 does not have to include the shield electrode layer 95. In other words, the shield electrode layer 95 is not an essential constituent element of the radio-frequency module 1 according to the embodiment of the present disclosure.

1.3 Effects and so Forth

As described above, the radio-frequency module 1 according to this embodiment includes the module substrate 91 having the main surfaces 91a and 91b that face each other, the resin member 93 that covers the main surface 91b, and the plurality of post electrodes 150 that are arranged so as to be spaced apart from each other on the main surface 91b and penetrate through the resin member 93 from the main surface 91b. The plurality of post electrodes 150 includes the first post electrode 151 and the first recess 931, which is recessed toward the main surface 91b, is formed in at least part of a region of the surface of the resin member 93 that surrounds the leading end part of the first post electrode 151.

With this configuration, since the first recess 931 is formed in at least part of the region that surrounds the leading end part of the first post electrode 151, the first recess 931 can be interposed between the first post electrode 151 and the other post electrodes 150. In other words, a space that is not filled with the resin member 93 can be interposed between the first post electrode 151 and the other post electrodes 150. Therefore, it is possible to suppress electric field coupling, magnetic field coupling, or electromagnetic coupling between the leading end part of the first post electrode 151 and the leading end parts of the other post electrodes 150 compared with the case where there is only the resin member 93 between the first post electrode 151 and the other post electrodes 150. As a result, it is possible to suppress interference between a signal flowing along the first post electrode 151 and signals flowing along the other post electrodes 150 even in the case where the distances between the first post electrode 151 and the other post electrodes 150 are small. Therefore, the isolation characteristics of the first post electrode 151 can be improved while making the radio-frequency module 1 small in size.

Furthermore, for example, in the radio-frequency module 1 according to this embodiment, the plurality of post electrodes 150 may further include the second post electrodes 152, the second recesses 932, which are recessed toward the main surface 91b, may be formed in at least parts of the regions of the surface of the resin member 93 that surround the leading end parts of the second post electrodes 152, and the second recesses 932 may be separated from the first recess 931.

This enables the isolation characteristics of the second post electrodes 152 to be improved similarly to those of the first post electrode 151. In addition, since the first recess 931 and the second recesses 932 can be spaced apart from one another, the resin member 93 can be interposed between the leading end part of the first post electrode 151 and the leading end parts of the second post electrodes 152. Therefore, the inflow of a bonding agent (for example, solder) can be halted inside the first recess 931 and the second recesses 932 even when the bonding agent has overflowed when bonding the first post electrode 151 and the second post electrodes 152 to a mother board or the like and the occurrence of short circuits between the leading end part of the first post electrode 151 and the leading end parts of the second post electrodes 152 can be suppressed.

Furthermore, for example, in the radio-frequency module 1 according to this embodiment, the first post electrode 151 may be the radio-frequency output terminal 120 for supplying a reception signal to the outside and one of the second post electrodes 152 may be the antenna connection terminal 100 that is connected to the antenna 2.

With this configuration, it is possible to suppress interference between a reception signal output from the radio-frequency output terminal 120 and a transmission signal output from the antenna connection terminal 100 and the isolation characteristics between transmission and reception can be improved.

Furthermore, for example, in the radio-frequency module 1 according to this embodiment, the first post electrode 151 may be the radio-frequency output terminal 120 for supplying a reception signal to the outside and one of the second post electrodes 152 may be the control terminal 130 for transmitting a control signal.

With this configuration, it is possible to suppress interference between a reception signal output from the radio-frequency output terminal 120 and a control signal that flows through the control terminal 130 and a fall in reception sensitivity can be suppressed.

Furthermore, for example, in the radio-frequency module 1 according to this embodiment, the first recess 931 may surround the entire periphery of the leading end part of the first post electrode 151 in a plan view of the module substrate 91. In addition, the first post electrode 151 may have a substantially cylindrical shape and the first recess 931 may have a substantially annular shape in a plan view of the module substrate 91.

With this configuration, the first recess 931 can be interposed between the first post electrode 151 and the other post electrodes 150 along the entire periphery of the first post electrode 151. Therefore, electric field coupling, magnetic field coupling, or electromagnetic field coupling with the leading end parts can be suppressed. As a result, the isolation characteristics of the first post electrode 151 can be further improved and interference between a signal flowing through the first post electrode 151 and signals flowing through the other post electrodes 150 can be further suppressed.

In addition, for example, in the radio-frequency module 1 according to this embodiment, the depth of the first recess 931 may be greater than or equal to the height of the part of the first post electrode 151 that is exposed from the resin member 93.

With this configuration, the exposed part of the first post electrode 151 can be completely accommodated inside the first recess 931. In other words, the resin member 93 can be interposed between the entire first post electrode 151 and the other post electrodes 150 in a cross section parallel to the main surface 91b. Therefore, when the first post electrode 151 is bonded to a mother board or the like, even when the bonding agent for the first post electrode 151 overflows, the overflowing bonding agent can be stopped inside the first recess 931 and the occurrence of short circuits between the leading end part of the first post electrode 151 and the leading end parts of the other post electrodes 150 can be suppressed.

Furthermore, for example, the radio-frequency module 1 according to this embodiment may further include the power amplifier 11 arranged on the main surface 91a and the low-noise amplifier 21 arranged on the main surface 91b.

With this configuration, circuit components can be arranged on both surfaces of the module substrate 91 and the radio-frequency module 1 can be reduced in size. In addition, since the power amplifier 11 and the low-noise amplifier 21 are arranged on opposite surfaces of the module substrate 91, coupling between the power amplifier 11 and the low-noise amplifier 21 can be suppressed and isolation characteristics between transmission and reception can be improved.

Furthermore, the communication device 5 according to this embodiment includes the RFIC 3 that processes radio-frequency signals and the radio-frequency module 1 that transmits radio-frequency signals between the RFIC 3 and the antenna 2.

With this configuration, the same effects can be realized with the communication device 5 as with the radio-frequency module 1.

Modifications

The shape and size of the plurality of recesses are not limited to the shape and size of the plurality of recesses 930 described in the above embodiment. Hereafter, modifications of the shape and size of the plurality of recesses will be described while referring to the drawings.

Figure 5A:
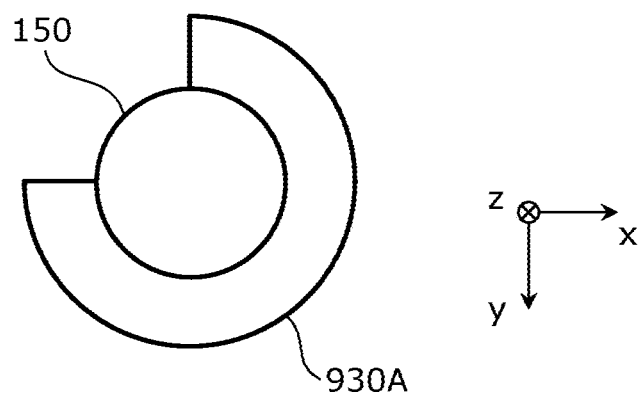
FIG. 5A is an enlarged plan view of a recess in modification 1 of the embodiment.

Modification 1 differs from the above embodiment in that recesses 930A do not surround the entire peripheries of the leading end parts of the post electrodes 150. FIG. 5A is an enlarged plan view of one recess 930A in modification 1 of the embodiment. As illustrated in FIG. 5A, each recess 930A is formed in only part of the region surrounding the leading end part of the corresponding post electrode 150.

Figure 5B:
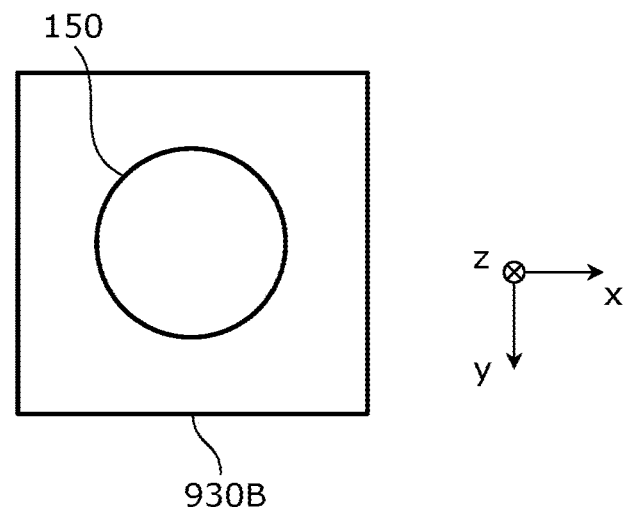
FIG. 5B is an enlarged plan view of a recess in modification 2 of the embodiment.

In modification 2, the outer shape of recesses 930B in a plan view is different from in the above embodiment. FIG. 5B is an enlarged plan view of one recess 930B in modification 2 of the embodiment. In FIG. 5B, the outer shape of the recess 930B in plan view is a substantially rectangular shape.

Figure 5C:
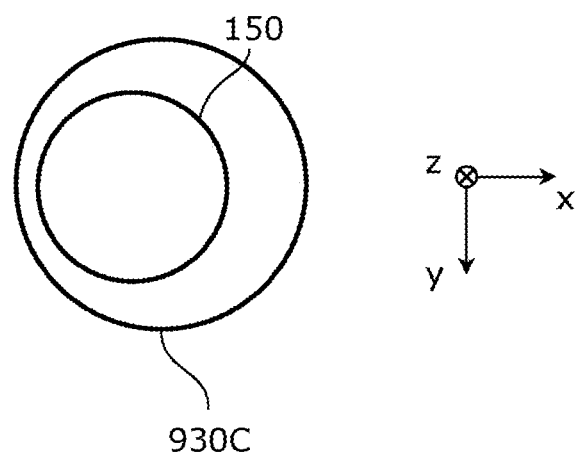
FIG. 5C is an enlarged plan view of a recess in modification 3 of the embodiment.

In modification 3, the symmetry positional relationship between recesses 930C and the post electrodes 150 is different from that in the above embodiment. FIG. 5C is an enlarged plan view of one recess 930C in modification 3 of the embodiment. As illustrated in FIG. 5C, the center of the recess 930C is shifted from the center of the corresponding post electrode 150 in a plan view. For example, in the case where there are no other post electrodes 150 in the negative x axis direction, the center of the recess 930C may be shifted in the negative x axis direction relative to the center of the corresponding post electrode 150 as in FIG. 5C.

Figure 5D:
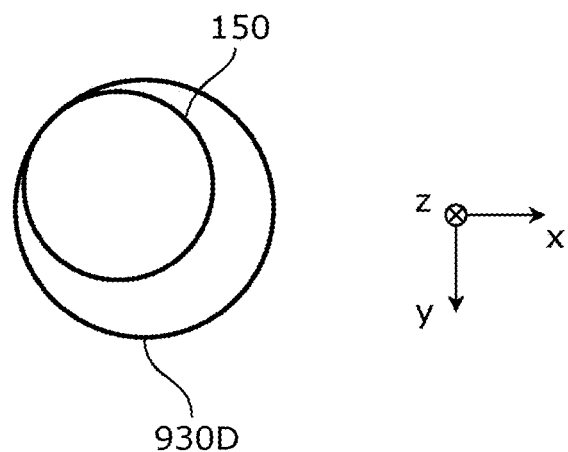
FIG. 5D is an enlarged plan view of a recess in modification 4 of the embodiment.

These modifications may be combined with each other. Modification 4 is a combination of modifications 1 and 3. FIG. 5D is an enlarged plan view of one recess 930D in modification 4 of the embodiment. As illustrated in FIG. 5D, the recess 930D does not surround the entire periphery of the leading end part of the corresponding post electrode 150 and the center of the recess 930D is shifted from the center of the corresponding post electrode 150.

As described above, even when the recesses 930A, 930B, 930C, or 930D are formed in the resin member 93, the recesses 930 can be interposed between each post electrode 150 and the other post electrodes 150. Therefore, the isolation characteristics of the post electrodes 150 can be improved in the modifications 1 to 4 similarly to as in the above embodiment.

The shape and size of the recesses are not limited to those given in these modifications. For example, the outer shape of the recesses in plan view is not limited to being a substantially circular or rectangular shape and may instead substantially be a triangular shape, a pentagonal shape, a hexagonal shape, or another polygonal shape. In addition, the sizes, and shapes of the plurality of recesses do not have to be identical and may vary in accordance with the functions and positional relationships of the post electrodes 150.

Other Modifications

The radio-frequency module and communication device according to an embodiment of the present disclosure described above have been described in the form of an embodiment and modifications of the embodiment, but a radio-frequency module and communication device according to embodiments of the present disclosure are not limited to the above-described embodiment and modifications. Other embodiments realized by combining any of the constituent elements of the above-described embodiment and modifications with one another, modifications obtained by modifying the above-described embodiment in various ways, as thought of by one skilled in the art, while not departing from the gist of the present disclosure, and various devices having the radio-frequency module and communication device built thereinto are included in the scope of the present disclosure.

For example, in the circuit configurations of the radio-frequency modules and communication devices according to the embodiment and modifications described above, other circuit elements, wiring lines, and so forth may be inserted midway along paths that connect the circuit elements and signal paths disclosed in the drawings. For example, a filter may be inserted between the antenna connection terminal 100 and the switch 53 in the above embodiment.

The arrangement of components in the above embodiment is merely an example and the arrangement is not limited to this example. For example, circuit components are arranged on both the main surfaces 91a and 91b of the module substrate 91 in the above embodiment, but circuit components may be arranged on just one out of the main surfaces 91a and 91b.

The radio-frequency module 1 includes both a transmission path for transmitting a transmission signal and a reception path for transmitting a reception signal in the above embodiment, but the radio-frequency module 1 may instead include only a transmission path or a reception path. In this case, the radio-frequency module 1 does not have to include one out of the power amplifier 11 and the low-noise amplifier 21. Furthermore, the radio-frequency module 1 need not include one out of the power amplifier 11 and the low-noise amplifier 21 and may include only a transmission filter and/or a reception filter.

Post electrodes are used as external connection terminals in the above embodiment, but the external connection terminals are not limited to being post electrodes. For example, bump electrodes may be used as the external connection terminals.

The present disclosure can be widely used in communication devices such as mobile phones as a radio-frequency module that is arranged in a front end unit.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
    a module substrate having a first main surface and a second main surface, the first main surface and the second main surface being on opposite sides of the module substrate;
    a resin member that covers the second main surface; and
    a plurality of external connection terminals that are spaced apart from each other on the second main surface and that penetrate through the resin member from the second main surface;
    wherein the plurality of external connection terminals include a first external connection terminal, and
    the resin member includes a first recess that is recessed toward the second main surface and formed in at least part of a region of a surface of the resin member that surrounds a leading end part of the first external connection terminal.

2. The radio-frequency module according to claim 1,
    wherein the plurality of external connection terminals includes a second external connection terminal,
    the resin member includes a second recess that is recessed toward the second main surface and formed in at least part of a region of the surface of the resin member that surrounds a leading end part of the second external connection terminal, and
    the second recess is separated from the first recess.

3. The radio-frequency module according to claim 2,
    wherein the first external connection terminal is a radio-frequency output terminal to supply a reception signal external to the radio-frequency module, and
    the second external connection terminal is an antenna connection terminal that is connected to an antenna.

4. The radio-frequency module according to claim 3,
    wherein a depth of the first recess is greater than or equal to a height of a part of the first external connection terminal that is exposed from the resin member.

5. The radio-frequency module according to claim 3,
    wherein the first recess surrounds an entire periphery of the leading end part of the first external connection terminal in a plan view of the module substrate.

6. The radio-frequency module according to claim 5,
    wherein a depth of the first recess is greater than or equal to a height of a part of the first external connection terminal that is exposed from the resin member.

7. The radio-frequency module according to claim 2,
    wherein the first external connection terminal is a radio-frequency output terminal to supply a reception signal external to the radio-frequency module, and
    the second external connection terminal is a control terminal to convey a control signal.

8. The radio-frequency module according to claim 7,
    wherein a depth of the first recess is greater than or equal to a height of a part of the first external connection terminal that is exposed from the resin member.

9. The radio-frequency module according to claim 7,
    wherein the first recess surrounds an entire periphery of the leading end part of the first external connection terminal in a plan view of the module substrate.

10. The radio-frequency module according to claim 9,
    wherein a depth of the first recess is greater than or equal to a height of a part of the first external connection terminal that is exposed from the resin member.

11. The radio-frequency module according to claim 2,
    wherein the first recess surrounds an entire periphery of the leading end part of the first external connection terminal in a plan view of the module substrate.

12. The radio-frequency module according to claim 11,
    wherein a depth of the first recess is greater than or equal to a height of a part of the first external connection terminal that is exposed from the resin member.

13. The radio-frequency module according to claim 2,
    wherein a depth of the first recess is greater than or equal to a height of a part of the first external connection terminal that is exposed from the resin member.

14. The radio-frequency module according to claim 1,
    wherein the first recess surrounds an entire periphery of the leading end part of the first external connection terminal in a plan view of the module substrate.

15. The radio-frequency module according to claim 14,
    wherein a depth of the first recess is greater than or equal to a height of a part of the first external connection terminal that is exposed from the resin member.

16. The radio-frequency module according to claim 14,
    wherein the first external connection terminal has a cylindrical shape, and
    the first recess has a annular shape in a plan view of the module substrate.

17. The radio-frequency module according to claim 16,
    wherein a depth of the first recess is greater than or equal to a height of a part of the first external connection terminal that is exposed from the resin member.

18. The radio-frequency module according to claim 1,
    wherein a depth of the first recess is greater than or equal to a height of a part of the first external connection terminal that is exposed from the resin member.

19. The radio-frequency module according to claim 1, further comprising:
    a power amplifier that is arranged on the first main surface; and a low-noise amplifier that is arranged on the second main surface.

20. A communication device comprising:
a signal processing circuit that processes radio-frequency signals; and
a radio-frequency module that transmits the radio-frequency signals between the signal processing circuit and an antenna, wherein the radio-frequency module includes
a module substrate having a first main surface and a second main surface, the first main surface and the second main surface being on opposite sides of the module substrate,
a resin member that covers the second main surface, and
a plurality of external connection terminals that are spaced apart from each other on the second main surface and that penetrate through the resin member from the second main surface;
wherein the plurality of external connection terminals include a first external connection terminal, and
the resin member includes a first recess that is recessed toward the second main surface and formed in at least part of a region of a surface of the resin member that surrounds a leading end part of the first external connection terminal.

* * * * *